United States Patent [19]
Liang et al.

[11] Patent Number: 5,639,696
[45] Date of Patent: Jun. 17, 1997

[54] MICROELECTRONIC INTEGRATED CIRCUIT MOUNTED ON CIRCUIT BOARD WITH SOLDER COLUMN GRID ARRAY INTERCONNECTION, AND METHOD OF FABRICATING THE SOLDER COLUMN GRID ARRAY

[75] Inventors: Dexin Liang, Fremont; Mark R. Schneider, San Jose, both of Calif.

[73] Assignee: LSI Logic Corporation, Milpitas, Calif.

[21] Appl. No.: 595,022

[22] Filed: Jan. 31, 1996

[51] Int. Cl.$^6$ ................................................ H01L 21/60
[52] U.S. Cl. .......................... 437/209; 437/211; 437/214; 437/217
[58] Field of Search .................................. 437/209, 211, 437/214, 215, 217, 218, 219, 220

[56] References Cited

U.S. PATENT DOCUMENTS 5,284,796  2/1994  Nakanishi et al. ...................... 437/209
5,288,944  2/1994  Bronson .................................. 437/209
5,346,857  9/1994  Scharr et al. .......................... 437/209
5,355,283  10/1994  Maars et al. .
5,359,768  11/1994  Haley .................................... 437/209

Primary Examiner—Kevin Picardat
Attorney, Agent, or Firm—Oppenheimer Poms Smith

[57] ABSTRACT

An integrated circuit is mounted on and interconnected with a circuit board by an array of electrically conductive columns. The assembly is fabricated by initially interconnecting the integrated circuit and the circuit board with an array of reflowable electrically conductive solder balls that correspond to the columns respectively. The circuit board is held with the integrated circuit extending downwardly therefrom. Sufficient heat is applied to cause the solder balls to reflow. The integrated circuit is pulled downwardly away from the circuit board by gravity such that the balls are stretched to form the columns, and the assembly is allowed to cool such that the columns solidify. A fixture may be provided against which the integrated circuit abuts after it has moved away from the circuit board by a predetermined distance such that the columns have a precisely determined height.

10 Claims, 3 Drawing Sheets

MICROELECTRONIC INTEGRATED CIRCUIT MOUNTED ON CIRCUIT BOARD WITH SOLDER COLUMN GRID ARRAY INTERCONNECTION, AND METHOD OF FABRICATING THE SOLDER COLUMN GRID ARRAY

BACKGROUND OF THE INVENTION

1. Field of the Invention

The present invention generally relates to the art of microelectronic integrated circuits, and more specifically to a microelectronic integrated circuit mounted on a circuit board with a solder column grid array interconnection, and a method of fabricating the column grid array.

2. Description of the Related Art

Packaged integrated circuits are advantageously mounted on printed circuit boards or motherboards using surface mount technology. A preferred form of this technology is known as Ball Grid Array (BGA) mounting, and includes forming conjugate planar arrays of mounting pads or contacts on surfaces of integrated circuits and circuit boards, and interconnecting the contacts using arrays of solder balls.

As viewed in FIG. 1, a conventional microelectronic assembly 10 comprises a packaged integrated circuit 12 which is mounted on a printed circuit board 14 by means of an array of electrically conductive solder balls 16. The contacts on the circuit 12 and board 14 are not explicitly shown for simplicity of illustration.

The solder balls 16 are made of 90 Pb—10 Sn alloy having a relatively high melting point in excess of 300° C. The balls 16 are adhered to and electrically interconnected with the contacts on the integrated circuit 12 by fillets 18a of eutectic Pb—Sn solder having a relatively low melting point of approximately 220° C. The balls 16 are similarly adhered to and electrically interconnected with the contacts on the circuit board 14 by fillets 18b of eutectic Pb—Sn solder The balls 16 are conventionally attached to the integrated circuit 12 and circuit board 14 using a fixture or boat made of graphite or similar material that is drilled with holes in a pattern matching the desired solder ball array. The 90 Pb—10 Sn solder balls 16 are loaded into the holes in the boat, and eutectic solder paste is screened directly onto the array. The integrated circuit 12 is aligned on top of the ball array, and heated in a furnace at a profile that melts only the eutectic solder to form the fillets 18a and 18b.

The integrated circuit 12 can have a variety of configurations. As illustrated in FIG. 1, the circuit 12 comprises a ceramic substrate 20 including one or more electrically insulative layers and electrical metallization layers. An integrated circuit chip 22 is attached to the top of the substrate 20, and electrically interconnected therewith by wire bonds 24 or the like. The chip 22 and wire bonds 24 are environmentally protected from physical damage and contamination by an encapsulation 26 formed of epoxy resin or the like.

Another conventional ball grid array mounting configuration is illustrated in FIG. 2, in which like elements are designated by the same reference numerals used in FIG. 1. A microelectronic assembly 30 comprises an integrated circuit 32 which is mounted on the circuit board 14 in the same manner as the integrated circuit 20. However, the circuit 32 comprises a substrate 34 having layers 34a, 34b and 34c. The layers 34a and 34b are formed with openings that define a cavity 36.

The integrated circuit 22 is mounted on top of the layer 34c in the cavity 36, and interconnected with the substrate 34 by the wire bonds 24. The cavity 36 faces away from the circuit board 14, whereby the configuration of FIG. 2 is known as "cavity-up" mounting. The cavity 36 provides ease of wire bonding and improved cooling, and is sealed by an encapsulation 38.

Another conventional assembly 40 is illustrated in FIG. 3, and is known as "cavity-down" mounting. In this case, an integrated circuit 42 includes a substrate 44 having layers 44a and 44b, with an opening being formed in the layer 44b to constitute a cavity 46 which faces the circuit board 14. The downwardly facing cavity 46 is protected with an encapsulation 48.

Several problems are associated with ball grid array configurations. One problem is that, due to the relatively small height and approximately unity aspect ratio of the solder balls 16, the arrays are susceptible to mechanical and thermal stresses which can result in an unacceptably high failure rate.

Another problem is that, especially in the cavity-down configuration of FIG. 3, a spacing "s" between the encapsulation 48 and the facing surface of the circuit board 14 is quite small. Since the balls 16 are mounted using flux solder, residual flux must be removed by a cleaning operation prior to encapsulation. The small spacing s makes the cleaning difficult. In addition, the tolerances for the encapsulation 48 must be maintained precisely to prevent the encapsulation 48 from being too thin or from contacting the circuit board 14.

These problems are alleviated by means of a column grid array (CGA) mounting configuration as illustrated in FIG. 4. In an assembly 50, the cavity-down integrated circuit 42 and circuit board 14 are the same as in FIG. 3. However, the ball grid array is replaced with a column grid array including cylindrical solder columns 52 which are formed of 90 Pb—10 Sn solder and attached using fillets 54a and 54b of eutectic Pb—Sn solder.

The columns 52 provide a larger spacing between the integrated circuit 42 and the circuit board 14, and thereby a larger spacing "s'" between the encapsulation 48 and the board 14. Whereas the solder balls 16 typically have a diameter of 30 mils (0.762 mm), the solder columns 52 typically have a height of 50 mils (1.27 mm) and diameter of 20 mils (0.508 mm). The increased height and aspect ratio of the columns 52 provide greater stress relief, ease of flux cleaning, and relaxed encapsulation height tolerance than the balls 16.

The column grid array assembly 50 is fabricated in a manner similar to the ball grid array assemblies, with the columns being inserted into drilled holes in a graphite fixture or boat and then attached to the integrated circuit 42 and circuit board 14 by the eutectic fillets 54a and 54b.

Solder balls can be fit into holes by pouring an excess number of balls over the surface of the boat, and shaking the boat to remove balls that did not fall into holes. However, the columns 52 are more difficult to insert into holes in a graphite boat than the balls 16. Due to the elongated shape, the columns 52 must be individually inserted into the holes in the boat. The small size of the columns, and the large number of columns (typically several hundred) in a typical column grid array, make this operation difficult and time consuming.

SUMMARY OF THE INVENTION

The problems inherent in the conventional fabrication of a microelectronic assembly with a column grid array interconnection are overcome by the present invention.

In accordance with the invention, an integrated circuit is mounted on and interconnected with a circuit board by an array of electrically conductive columns. The assembly is fabricated by initially interconnecting the integrated circuit and the circuit board with an array of reflowable electrically conductive solder balls that correspond to the columns respectively.

The circuit board is held with the integrated circuit extending downwardly therefrom. Sufficient heat is applied to cause the solder balls to reflow. The integrated circuit is pulled downwardly away from the circuit board by gravity such that the balls are stretched to form the columns, and the assembly is allowed to cool such that the columns solidify.

A fixture may be provided against which the integrated circuit abuts after it has moved away from the circuit board by a predetermined distance such that the columns have a precisely determined height.

The present column grid array provides all of the advantages of the conventional column grid array which was described above with reference to FIG. 4, but can be fabricated with the ease of a ball grid array. More specifically, the difficult and time consuming operation of individually inserting tiny solder columns into holes in a graphite fixture or boat is eliminated by the present invention.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
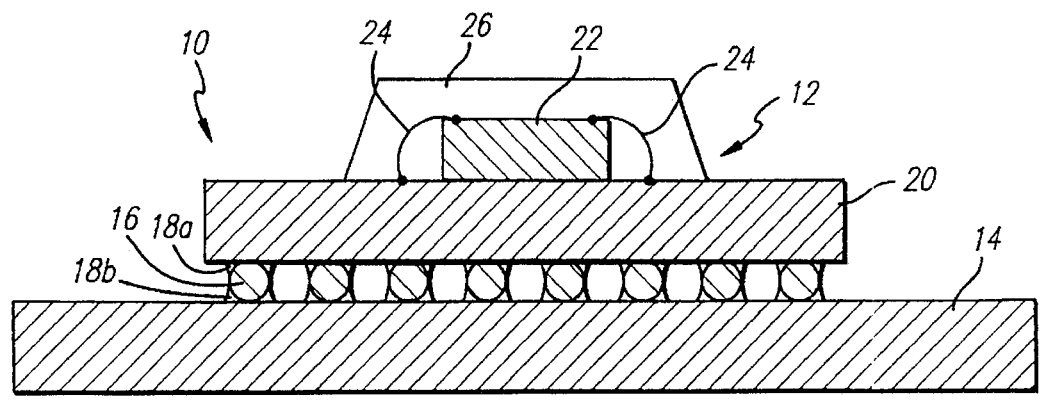
FIGS. 1 to 3 are simplified sectional views illustrating conventional microelectronic assemblies including ball grid array mounting.
Figure 2:
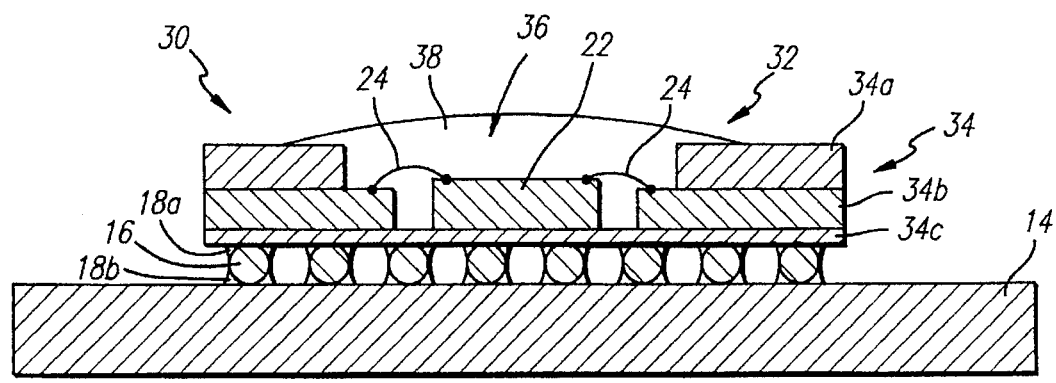
Figure 3:
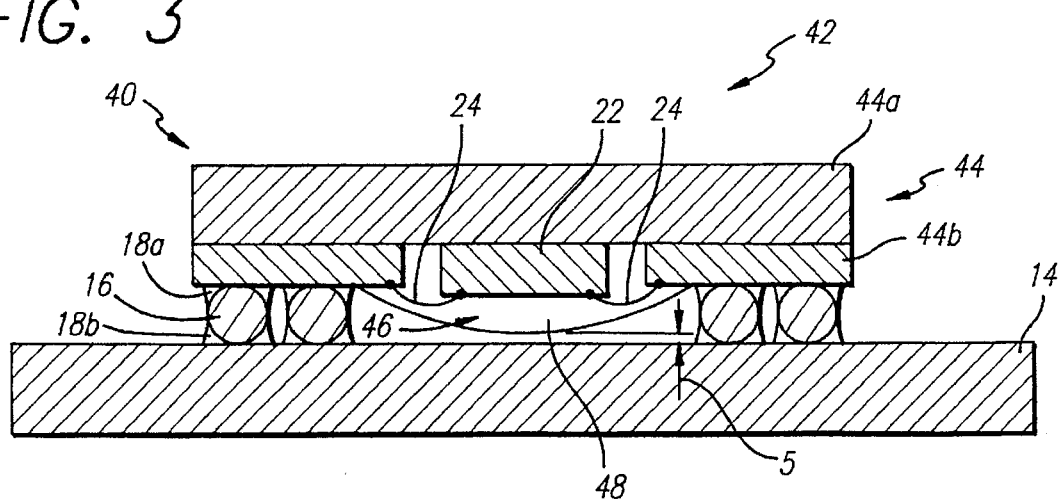
Figure 4:
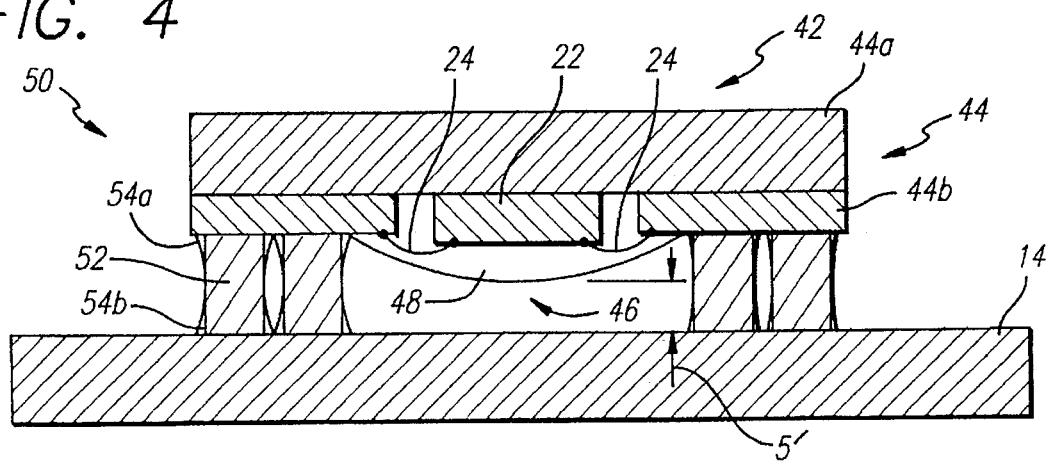
FIG. 4 is a simplified sectional view illustrating a conventional microelectronic assembly including column grid array mounting.
Figure 5:
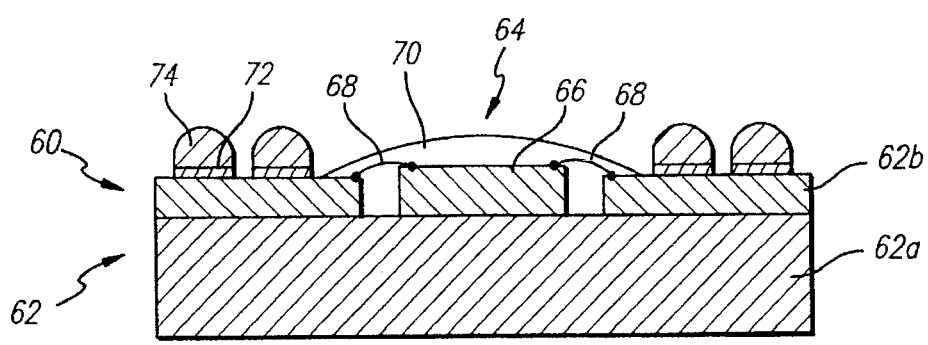
FIGS. 5 to 7 are simplified sectional views illustrating a method of fabricating a microelectronic assembly including column grid mounting according to the present invention.

A method of fabricating a microelectronic assembly including column grid mounting according to the present invention is illustrated in FIG. 5. As illustrated, the method produces an assembly including a cavity-down integrated circuit as illustrated in FIGS. 3 and 4. However, the invention is not so limited, and can accommodate a variety of integrated circuit configurations such as illustrated in FIGS. 1 and 2.

The first step of the method is to fabricate a packaged integrated circuit 60 having a ball grid array formed thereon as illustrated in FIG. 5. The circuit 60 includes a ceramic laminate or other substrate 62 including one or more insulative and metallization layers. As shown, the substrate 62 includes layers 62a and 62b. An opening is formed in the layer 62b to form a cavity 64.

An integrated circuit chip 66 is mounted on the layer 62a in the cavity 64, and interconnected with the substrate 62 by wire bonds 68 or the like. The cavity 64 is environmentally sealed by an encapsulant 70.

An array of electrical mounting or contact pads 72 is formed on the surface of the substrate 62, and an array of electrically conductive solder balls 74 is formed on the pads 72. The balls 74 are preferably formed of eutectic Pb—Sn solder having a melting point of approximately 220° C.

The balls 74 are adhered to the pads 72 by applying flux to the pads 72, inserting the balls 74 into holes in a graphite fixture or boat in a conventional manner, aligning the pads 72 on top of the balls 74, and applying heat using a temperature profile such that the balls 74 reach a temperature of approximately 220° C. for about one minute. This causes the balls 74 to reflow onto the pads 72, and thereby become ohmically attached to the pads 72. It will be noted that the bottoms of the balls 74 conform to the flat shape of the pads 72 during reflow.

Figure 6:
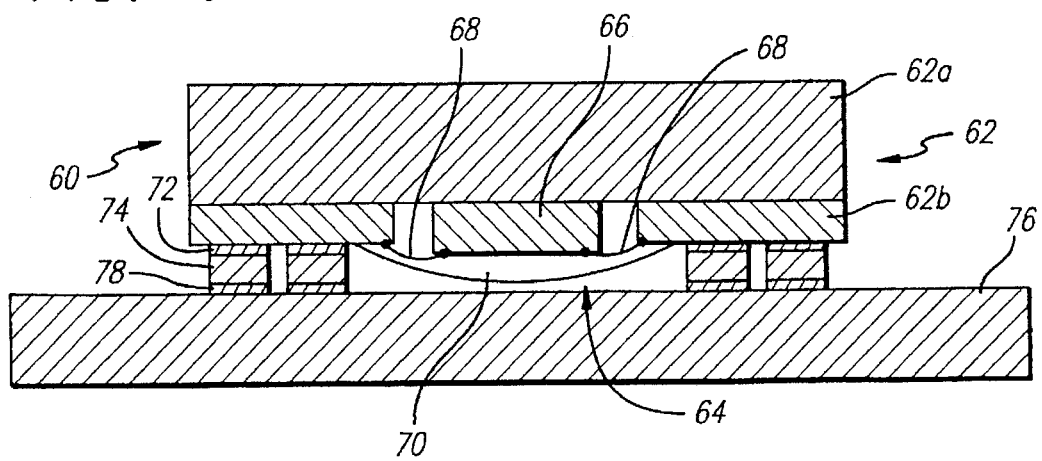

As illustrated in FIG. 6, the integrated circuit 60 is attached to a circuit board 76 to form an intermediate assembly including ball grid array mounting. The circuit 60 is inverted and placed on the board 76 such that the solder balls 74 engage with conjugate terminals or contact pads 78 on the board 76. Preferably, eutectic Pb—Sn solder/flux paste is applied to the balls 74 prior to mounting on the circuit 60 on the board 76. Then, sufficient heat is applied such that the balls 74 reflow and adhere to the pads 78.

The intermediate assembly of FIG. 6 is similar to a conventional ball grid array configuration, except that the present solder balls are formed of low reflow temperature eutectic solder rather than high temperature reflow 90 PB—10 Sn solder as in the prior art.

Figure 7:
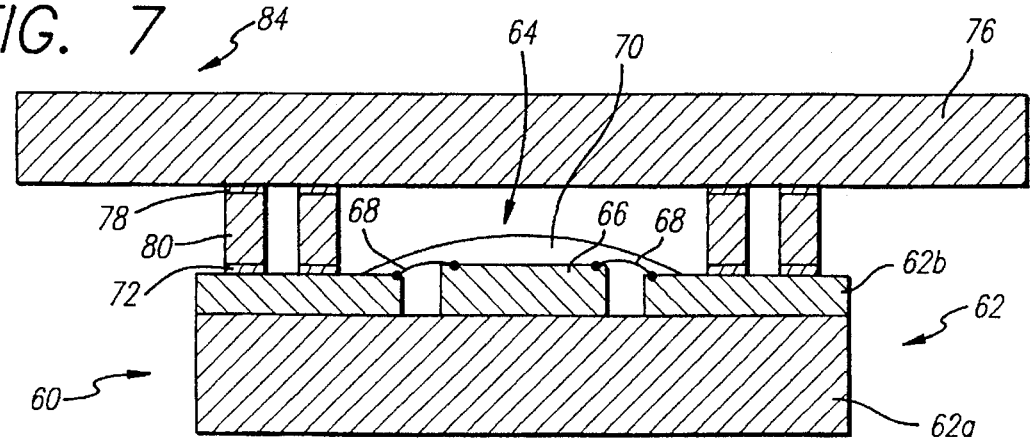

Then, as illustrated in FIG. 7, the assembly of FIG. 6 is inverted such that the integrated circuit 60 extends downwardly from the circuit board 76. The circuit board 76 is held stationary, the solder balls 74 are again heated to reflow temperature (220° C.), and the circuit 60 is urged by gravity to move downwardly relative to the board 76 as indicated by arrows 82. This causes the solder balls 74 to be stretched into an elongated shape and form solder columns 80. The heat is then removed, and the solder solidifies into the column shapes as illustrated to provide a microelectronic assembly 84.

In this manner, a solder ball grid array is transformed into a solder column grid array. Although the dimensions of the configuration are variable depending on a particular application, the solder balls 74 may have an initial diameter of approximately 30 mils (0.762 mm). The solder columns 80 may have a height of approximately 45 to 50 mils (1.143–1.27 mm), and a diameter of approximately 20 mils (0.5 mm).

The present column grid array provides all of the advantages of the conventional column grid array which was described above with reference to FIG. 4, but can be fabricated with the ease of a ball grid array. More specifically, the difficult and time consuming operation of individually inserting tiny solder columns into holes in a graphite fixture or boat is eliminated by the present invention.

Figure 8:
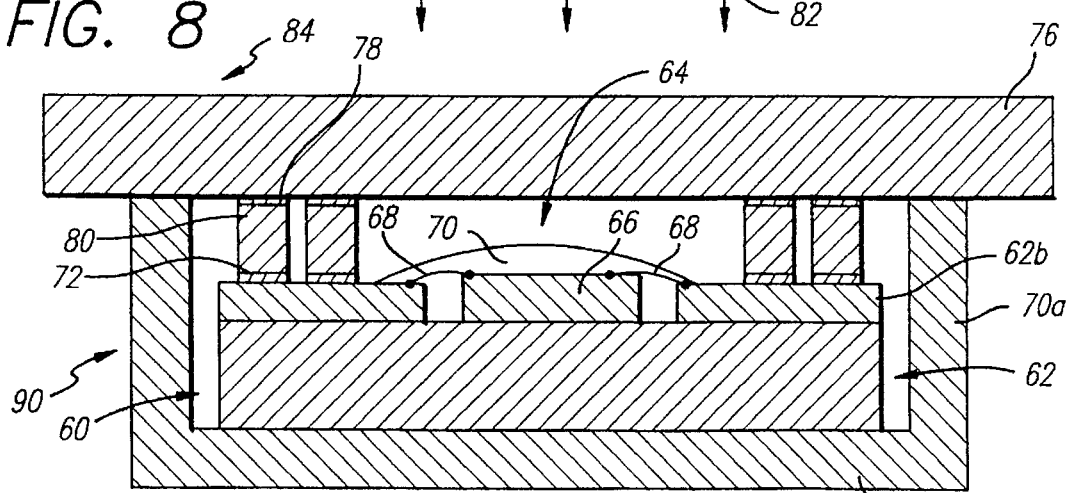
FIG. 8 is a simplified sectional view illustrating a fixture for practicing the method of FIGS. 5 to 7.

FIG. 8 illustrates how a fixture 90 may be provided to provide precise spacing between the integrated circuit 60 and the circuit board 76, and thereby a precise height for the solder columns 80. The fixture 90 has a rectangular open box shape with upstanding walls 90a and a bottom 90b.

The height of the walls 90a above the bottom 90b is selected such that the circuit board 76 is retained by the walls 90a, and the integrated circuit 60 abuts against the bottom 90b when it has moved downwardly away from the circuit board 76 during solder reflow by a distance such that the desired spacing has been achieved. This automatically provides a precise height for the solder columns 80.

Figure 9:
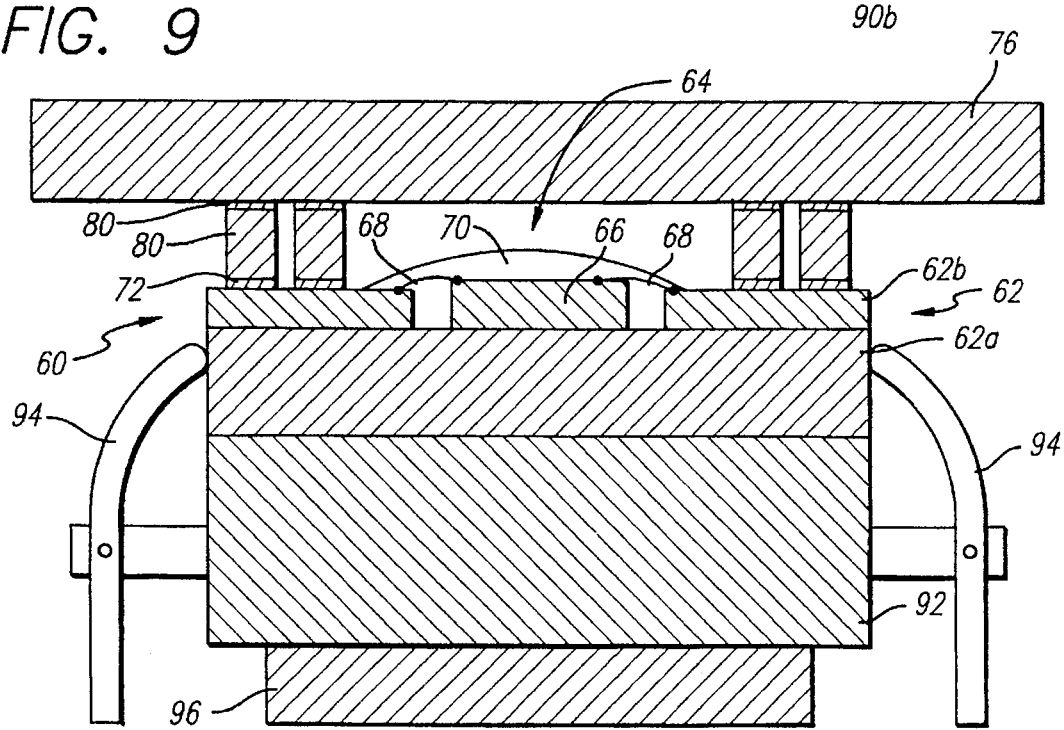
FIG. 9 is a simplified sectional view illustrating a weight and stopper assembly for practicing the method of FIGS. 5 to 7.

FIG. 9 illustrates an arrangement which can be used where the integrated circuit 60 is so light that its weight is insufficient to cause it to move downwardly away from the circuit board 76 during solder reflow. In this case, a weight 92 is temporarily attached to the integrated circuit 60 by clips 94 or the like.

The size of the weight 92 is selected to cause the integrated circuit 60 to move to a desired extent during reflow. It is further within the scope of the invention to provide a stopper 96 below the weight 92 such that the weight 92 will abut against the stopper 96 when the integrated circuit 60 has moved downwardly by a desired amount. This concept is similar to that described above with reference to FIG. 8.

Various modifications will become possible for those skilled in the art after receiving the teachings of the present disclosure without departing from the scope thereof.

For example, the present solder balls 74 can be made of high reflow temperature solder such as 90 Pb—10 Sn, and the reflow step of FIG. 7 performed at a temperature of approximately 350° C.

It is further within the scope of the invention to manually pull the integrated circuit 60 away from the circuit board 76 during reflow, rather than relying on gravity. In this case, the relative orientation between the integrated circuit and the circuit board during reflow is unlimited.

We claim:

1. A method of forming an array of electrically conductive columns for interconnecting first and second microelectronic devices, comprising the steps of:

(a) interconnecting the first and second microelectronic devices with an array of reflowable electrically conductive balls that correspond to said columns respectively;

(b) applying heat to cause said balls to reflow;

(c) causing relative movement of said first and second microelectronic devices away from each other such that said balls are stretched to form said columns; and (d) removing said heat.

2. A method as in claim 1, in which step (a) comprises forming said balls of solder.

3. A method as in claim 2, in which:

step (a) comprises forming said balls of Pb—Sn eutectic solder; and step (b) comprises applying said heat such that said balls reach a temperature of approximately 220° C.

4. A method as in claim 1, in which:

the first microelectronic device comprises an integrated circuit having a planar array of first electrical contacts;

the second microelectronic device comprises a circuit board having a planar array of second electrical contacts which are conjugate to said first electrical contacts; and step (a) comprises interconnecting respective first and second electrical contacts with said balls.

5. A method as in claim 4, in which:

the integrated circuit has an encapsulated cavity which faces and is spaced from the circuit board after performing step (d); and the method further comprises the step of:

(e) cleaning a space defined between said encapsulated cavity and the circuit board.

6. A method as in claim 5, in which:

step (a) comprises forming said balls of solder which contains flux; and step (e) comprises removing flux from said space.

7. A method as in claim 1, in which steps (b) and (c) in combination comprise holding the first microelectronic device above the second microelectronic device and allowing gravity to pull the second microelectronic device downwardly away from the first microelectronic device.

8. A method as in claim 7, in which steps (b) and (c) in combination comprise holding the first microelectronic device using a fixture having a surface against which the second microelectronic device abuts after moving downwardly away from the first microelectronic device by a predetermined distance.

9. A method as in claim 7, in which step (c) further comprises attaching a weight to the second microelectronic device.

10. A method as in claim 9, in which step (c) further comprises providing a stopper below the weight such that the weight abuts against the stopper after the second microelectronic device has moved downwardly away from the first microelectronic device by a predetermined distance.

* * * * *